(12) United States Patent
Kawai (10) Patent No.: US 9,831,550 B2
(45) Date of Patent: Nov. 28, 2017

(54) PHASE SHIFTER, PREDISTORTER, AND PHASED ARRAY ANTENNA

(71) Applicant: SOCIONEXT INC., Yokohama-shi, Kanagawa (JP)

(72) Inventor: Shigeaki Kawai, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 511 days.

(21) Appl. No.: 14/462,461

(22) Filed: Aug. 18, 2014

(65) Prior Publication Data

US 2015/0070242 A1 Mar. 12, 2015

(30) Foreign Application Priority Data

Sep. 11, 2013 (JP) ................................. 2013-188713

(51) Int. Cl.
*H03H 7/20* (2006.01)
*H01Q 3/36* (2006.01)
*H03F 1/32* (2006.01)
*H03H 7/21* (2006.01)
*H03F 3/24* (2006.01)
*H01P 5/10* (2006.01)
*H03H 7/42* (2006.01)

(52) U.S. Cl.
CPC ............. *H01Q 3/36* (2013.01); *H03F 1/3288* (2013.01); *H03F 3/24* (2013.01); *H03H 7/20* (2013.01); *H03H 7/21* (2013.01)

(58) Field of Classification Search
CPC ............... H03H 7/42; H03H 7/20; H01P 5/10
USPC .................. 333/25, 26, 139, 161; 455/114.3; 343/821
See application file for complete search history.

(56) References Cited

U.S. PATENT DOCUMENTS 4,122,447 A * 10/1978 Kawai .................... H01Q 21/22
 333/110
4,725,767 A 2/1988 Mori
5,119,396 A 6/1992 Snderford, Jr.
(Continued)

FOREIGN PATENT DOCUMENTS

JP 62-278813 A 12/1987
JP 06-069701 A 3/1994
(Continued)

OTHER PUBLICATIONS

Japanese Office Action of related Japanese Patent Application No. 2013-188713 dated May 30, 2017.

*Primary Examiner* — Dean Takaoka
(74) *Attorney, Agent, or Firm* — Arent Fox LLP (57) ABSTRACT

There are provided a transformer including inductors, and variable capacitors. Capacitance values of the variable capacitors are controlled by a control signal. One end of the first inductor is connected to a reference potential, the first variable capacitor is connected in series between the other end of the first inductor and a first terminal, the second variable capacitor is connected in series between one end of the second inductor and a second terminal, the third variable capacitor is connected in series between the other end of the second inductor and a third terminal. The capacitance values of the variable capacitors are changed by the control signal to obtain a desired pass phase, a loss is small, and both functions of a single-phase-differential conversion and a phase shifter are realized.

19 Claims, 7 Drawing Sheets

(56) References Cited

U.S. PATENT DOCUMENTS

| | | | |
|---|---|---|---|
| 5,382,926 A | | 1/1995 | Nakahara et al. |
| 6,741,814 B1 * | | 5/2004 | Kosoff ..................... H01P 5/10 |
| | | | 333/25 |
| 7,209,727 B2 * | | 4/2007 | Castaneda ........... H03F 3/45188 |
| | | | 455/341 |
| 7,994,873 B2 * | | 8/2011 | Shyu ........................ H03H 7/42 |
| | | | 333/236 |
| 2002/0180523 A1 | | 12/2002 | Okubo et al. |
| 2008/0197925 A1 | | 8/2008 | Furuta et al. |
| 2008/0272962 A1 | | 11/2008 | Milano et al. |
| 2008/0278258 A1 | | 11/2008 | Liu |
| 2008/0278369 A1 | | 11/2008 | Milano |
| 2010/0103043 A1 | | 4/2010 | Milano |
| 2010/0141339 A1 * | | 6/2010 | Day ..................... H03F 1/3211 |
| | | | 330/149 |
| 2010/0188289 A1 | | 7/2010 | Milano et al. |
| 2010/0233971 A1 * | | 9/2010 | Vassiliou ............... H04B 17/14 |
| | | | 455/73 |
| 2012/0314811 A1 * | | 12/2012 | Goldfarb ............. H03D 7/1441 |
| | | | 375/316 |
| 2013/0200959 A1 * | | 8/2013 | Chen .................. H01P 1/20381 |
| | | | 333/26 |

FOREIGN PATENT DOCUMENTS

| | | | |
|---|---|---|---|
| JP | 2001-285006 A | | 10/2001 |
| JP | 2002177404 A | * | 6/2002 |
| JP | 2002-330032 A | | 11/2002 |
| JP | 2004-328254 A | | 11/2004 |
| JP | 2008-295089 A | | 12/2008 |
| JP | 2010-506484 A | | 2/2010 |
| JP | 2010-530151 A | | 9/2010 |

* cited by examiner

PHASE SHIFTER, PREDISTORTER, AND PHASED ARRAY ANTENNA

CROSS-REFERENCE TO RELATED APPLICATION

This application is based upon and claims the benefit of priority of the prior Japanese Patent Application No. 2013-188713, filed on Sep. 11, 2013, the entire contents of which are incorporated herein by reference.

FIELD

The embodiment discussed herein is directed to a phase shifter, a predistorter, and a phased array antenna.

BACKGROUND

A phase shifter changes a phase difference (pass phase) between an input signal and an output signal by controlling a voltage and the like supplied to a control terminal. The phase shifter is used for phase adjustment in a circuit, for example. The phase shifter is applied to, for example, a predistorter for phase distortion, a phased array antenna and the like. As the phase shifter, one with a configuration using a transmission line (for example, refer to Patent Document 1), and one with a configuration using inductors (for example, refer to Patent Document 2) are known.

A differential circuit configuration is generally employed in an analog circuit such as an amplifier and a mixer. The differential circuit can reduce an influence of element variance and a power supply noise, so that it is widely used in a semiconductor device. Meanwhile, a single-phase signal is preferable when a signal is transmitted to an exterior of the semiconductor device, because of a reason such that a number of terminals is limited, and it is difficult to configure an equal-length wiring in the exterior of the semiconductor device. For this reason, it is performed to convert a single-phase signal into a differential signal, and to convert a differential signal into a single-phase signal in the semiconductor device.

There is a balun, as one of circuits conducting a single-phase-differential conversion. The balun is realized by connecting one side of a transformer to a reference potential. In the balun, since a primary side and a secondary side of the transformer are coupled only by a mutual induction of inductors, it is possible to separate the reference potential, and the balun is used for the single-phase-differential conversion. The single-phase-differential conversion realized by the balun causes a low loss and a small distortion, so that the balun is used for a single-phase-differential conversion of input and output signals in an amplifier circuit and the like in which low distortion and high gains are demanded, for example. On the other hand, a transformer and inductors configuring the balun occupy a large area and thus an integration thereof is difficult, resulting in that an occupied area in a semiconductor device increases.

[Patent Document 1] Japanese Laid-open Patent Publication No. 06-69701

[Patent Document 2] Japanese Laid-open Patent Publication No. 62-278813

For example, it is considered to control a pass phase by using, in a differential circuit, a phase shifter with the configuration using the transmission line or the configuration using the inductors described above. For example, the configuration using the transmission line as the phase shifter disclosed in Patent Document 1 uses a ($\lambda/4$) transmission line, so that a large area becomes necessary for realizing the phase shifter. For example, when a phase shifter dealing with a signal of 2 GHz used for wireless communication and the like is employed, a $\lambda/4$ becomes 3.75 cm in a vacuum. A wavelength shortening ratio realized by a dielectric is about 0.3 times at the most even on a dielectric substrate and the like, so that a length of a transmission line is 1 cm, resulting in that an area is increased and it is difficult to realize an integration. In the configuration using the inductors as the phase shifter disclosed in Patent Document 2, for example, since two inductors are added to be used, a circuit area and a number of parts are increased.

With respect to such problems, a phase shifter using resistors and variable capacitors is proposed (for example, refer to Patent Document 2). In the configuration of using the resistors and the variable capacitors as the phase shifter, an increase in a circuit area can be suppressed, but, a loss is increased due to the resistors. If, as a countermeasure against this, an amplifier for compensating the loss is used, a consumption current is increased, in addition to the increase in the circuit area and the number of parts.

SUMMARY

According to an aspect of the embodiments, a phase shifter includes a transformer including a first inductor and a second inductor, and first to third variable capacitors. Capacitance values of the first to third variable capacitors are controlled by a control signal. One end of the first inductor is connected to a reference potential, and the first variable capacitor is connected in series between the other end of the first inductor and a first terminal. The second variable capacitor is connected in series between one end of the second inductor and a second terminal, and the third variable capacitor is connected in series between the other end of the second inductor and a third terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, preferred embodiments will be described based on the drawings.

<Phase Shifter>

Figure 1:
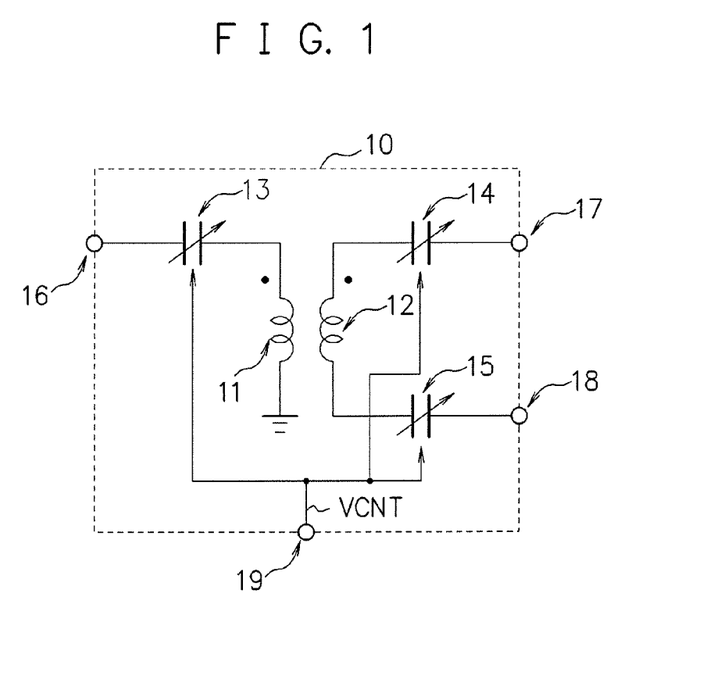
FIG. 1 is a diagram illustrating a configuration example of a phase shifter in a present embodiment.

FIG. 1 is a diagram illustrating a configuration example of a phase shifter in a present embodiment. A phase shifter 10 in the present embodiment includes magnetically coupled inductors 11, 12, and variable capacitors 13, 14, 15. The phase shifter 10 includes, as input and output terminals of signal whose pass phase is controlled, a first terminal 16 being a terminal related to a single-phase signal, and a second terminal 17 and a third terminal 18 being terminals related to a signal pair of differential signal. The phase shifter 10 includes a control terminal 19 as an input terminal of a control signal for controlling the pass phase.

One end of the inductor 11 on one side out of a primary side and a secondary side of a transformer is connected to the first terminal 16 via the variable capacitor 13, and the other end of the inductor 11 is connected to a reference potential. One end of the inductor 12 on the other side out of the primary side and the secondary side of the transformer is connected to the second terminal 17 via the variable capacitor 14, and the other end of the inductor 12 is connected to the third terminal 18 via the variable capacitor 15. Namely, the variable capacitor 13 is connected in series between the one end of the inductor 11 on the single-phase side and the first terminal 16, and the other end of the inductor 11 is connected to the reference potential. The variable capacitor 14 is connected in series between the one end of the inductor 12 on the differential side and the second terminal 17, and the variable capacitor 15 is connected in series between the other end of the inductor 12 and the third terminal 18.

Capacitance values of the variable capacitors 13, 14, 15 are controlled in accordance with a control signal VCNT input from the control terminal 19. As the variable capacitors 13, 14, 15, it is possible to apply varactors with a diode structure (variable capacitance diodes), for example (for example, FIG. 6), varactors with a MOS (metal oxide semiconductor) structure (for example, FIG. 14), and circuits each formed of fixed capacitors whose capacitance values are fixed and switches controlled to be opened/closed in accordance with the control signal VCNT (for example, FIG. 13).

In other words, the phase shifter 10 includes a balun using a transformer converting a single-phase signal into a differential signal or converting a differential signal into a single-phase signal with the use of a coupling of magnetic fluxes of the mutual inductors 11, 12. The variable capacitor 13 and the variable capacitors 14, 15 are connected in series with respect to the single-phase side and the differential side, respectively, of this balun.

Hereinafter, explanation in which the circuit illustrated in FIG. 1 in which the variable capacitors 13, 14, 15 are connected to the balun using the transformer including the inductors 11, 12 operates as the phase shifter, will be made. Note that, an example in which the single-phase side of the balun is set as a primary side and the differential side of the balun is set as a secondary side will be explained, but, the circuit similarly operates as the phase shifter even if the single-phase side of the balun is set as the secondary side and the differential side of the balun is set as the primary side.

Figure 2A:
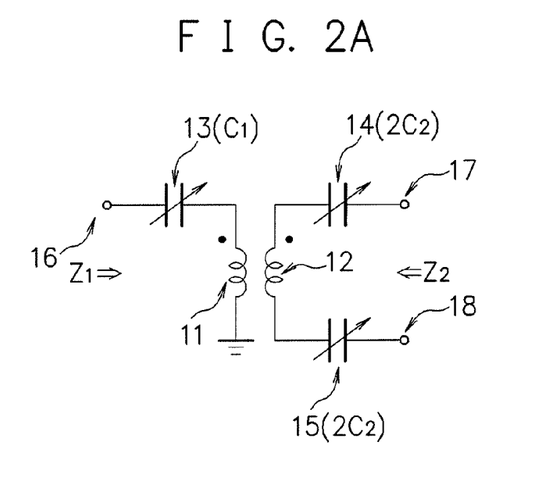
FIG. 2A is a diagram illustrating a phase shifter in the present embodiment.
Figure 2B:
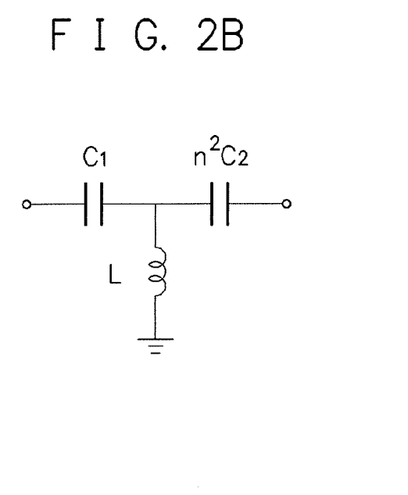
FIG. 2B is a diagram illustrating an equivalent circuit conversion of the phase shifter in the present embodiment.

As illustrated in FIG. 2A, a capacitance value of the variable capacitor 13 is set to $C_1$, and capacitance values of the variable capacitors 14, 15 are set to $2C_2$. In FIG. 2A, components same as the components illustrated in FIG. 1 are denoted by the same reference numerals. A result of performing equivalent circuit conversion of a half circuit in the differential circuit and a balun, and equivalent conversion of circuit by removing an ideal transformer by impedance conversion in regard to the circuit illustrated in FIG. 2A, corresponds to a circuit illustrated in FIG. 2B. In FIG. 2B, L indicates a self-inductance in the equivalent circuit of the balun. Note that in the circuit illustrated in FIG. 2B, a coefficient n of capacitance on the secondary side indicates a ratio of transformation of the balun. When an input impedance on the primary side is set to $Z_1$, and an input impedance on the secondary side is set to $Z_2$, $n^2=Z_2/2Z_1$ is satisfied.

Figure 3A:
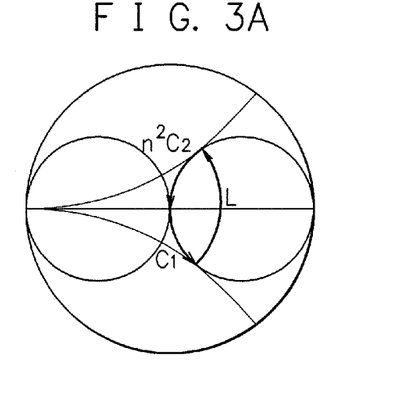
FIG. 3A and FIG. 3B are diagrams illustrating impedance loci of the circuit illustrated in FIG. 2B.

A characteristic of T-type circuit formed by $C_1$, L, $n^2C_2$ illustrated in FIG. 26 is considered. Here, if both of input and output impedances are set to $Z_1$, and values of L, $C_1$, $C_2$ are properly selected, an impedance draws a locus as illustrated in FIG. 3A on a Smith chart, and returns to $Z_1$. If, when angular frequency of input signals is ω, it is set that $\omega C_1=\omega n^2 C_2=1/Z_1$, and $\omega L=Z_1$ are satisfied, the input and the output are simultaneously matched, so that a reflection loss becomes 0, and since there is no loss inside of the circuit, an insertion loss also becomes 0.

Figure 3B:
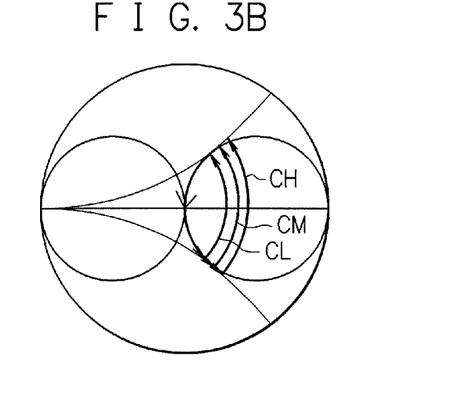

At this point, a tangent to a circle of $re(Z)=Z_1$ passing a center of the Smith chart and a tangent to a curve of fixed susceptance are overlapped. Namely, even when a magnitude of $C_1=n^2C_2$ is changed in the vicinity of this point, the matching can be similarly performed by the same magnitude of susceptance. Namely, even if capacitance values are changed as illustrated in FIG. 3B, it is possible to maintain a small reflection loss with a certain inductance of parallel L in the vicinity of $C_1=n^2C_2$. In FIG. 3B, CM indicates a locus when it is set that $C_1=n^2C_2=C_0$, CL indicates a locus when it is set that $C_1=n^2C_2=C_0-\Delta C$, and CH indicates a locus when it is set that $C_1=n^2C_2=C_0+\Delta C$.

Meanwhile, regarding a pass phase, when values of $C_1$, $C_2$ are changed, a pole of a high-pass filter formed of capacitors and inductance is changed, so that it is possible to change the pass phase by changing the capacitance values.

FIG. 4A to FIG. 4D are diagrams for explaining characteristics of the phase shifter 10 in the present embodiment. FIG. 4A to FIG. 4D represent simulation results when the phase shifter 10 is designed by setting a target frequency to 1.9 GHz to 2.1 GHz, and $C_1$, $C_2$, L, n are determined while referring to the Smith chart illustrated in FIG. 3B, thereby changing capacitance values. In FIG. 4A to FIG. 4D, CM indicates a characteristic when it is set that $C_1=n^2C_2=C_0$, CL indicates a characteristic when it is set that $C_1=n^2C_2=C_0-\Delta C$, and CH indicates a characteristic when it is set that $C_1=n^2C_2=C_0+C$.

Figure 4A:
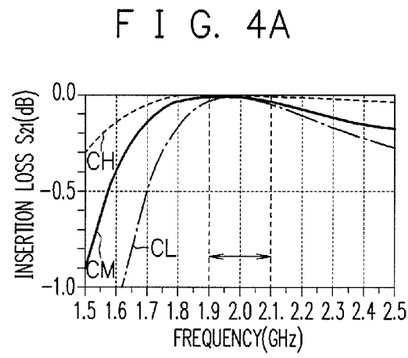
FIG. 4A to FIG. 4D are diagrams for explaining characteristics of the phase shifter in the present embodiment.
Figure 4B:
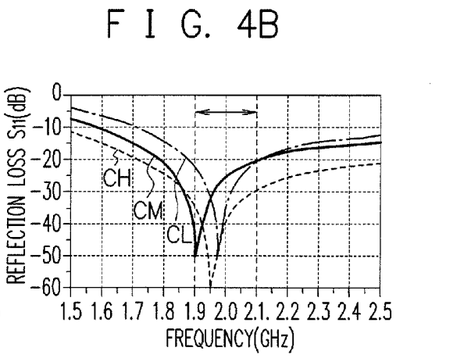
Figure 4C:
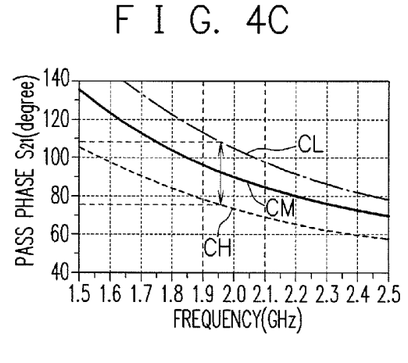
Figure 4D:
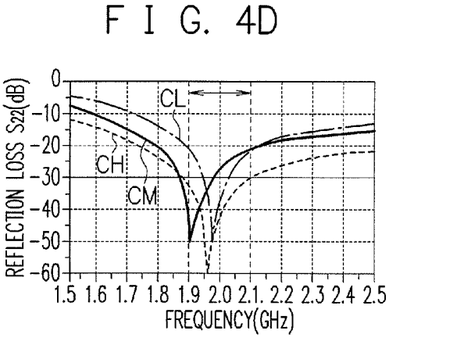

FIG. 4A illustrates an insertion loss when a signal is input from the first terminal 16. FIG. 4B illustrates a reflection loss when a signal is input from the first terminal 16. FIG. 4C illustrates a pass phase (phase difference of input signal and output signal) when a signal is input from the first terminal 16. FIG. 4D illustrates a reflection loss when signals are input from the second terminal 17 and the third terminal 18. From the characteristics illustrated in FIG. 4A to FIG. 4D, it can be understood that by properly selecting the values of $C_1$, $C_2$, L, both of the insertion loss and the reflection loss are small in a frequency of 1.9 GHz to 2.1 GHz being the target frequency, and by changing the capacitance values, the pass phase can be changed by 30 degrees.

In the above description, explanation is made by setting a coupling coefficient k in the transformer to 1, but, when the coupling coefficient k is less than 1, a series leakage inductance is generated in the circuit as a result of performing the equivalent conversion. However, since it is possible to eliminate an influence of the leakage inductance by the capacitors connected in series, so that by properly controlling the capacitance values, it is possible to suppress the influence of the leakage inductance.

As described above, in the phase shifter 10 in the present embodiment, the variable capacitor 13 and the variable capacitors 14, 15 are connected in series with respect to the single-phase side and the differential side, respectively, of the balun using the transformer including the inductors 11, 12. By controlling a phase shift amount of an output signal by controlling the capacitance values of the variable capacitors 13, 14, 15 with the use of the control signal VCNT, a desired pass phase can be obtained, and it is possible to realize both functions of the single-phase-differential conversion and the phase shifter with the use of one balun. Since the configuration in which the variable capacitors 13, 14, 15 are connected to the balun is employed, the loss is small, and an increase in a circuit area and a number of parts can also be suppressed.

<Predistorter>

Next, a predistorter using the phase shifter in the present embodiment will be described.

The predistorter generates a phase distortion opposite to a phase distortion to be caused in a circuit connected at a subsequent stage, thereby improving a phase distortion of an output signal. For example, when a phase distortion in an amplifier (power amplifier) in a transmission circuit and the like becomes a problem, by disposing, at a previous stage of the amplifier, a predistorter which causes a phase distortion whose characteristic is opposite to that of a phase distortion in the amplifier, it is possible to reduce a phase distortion of a signal output from the amplifier. The predistorter formed of the phase shifter changes a control signal of the phase shifter in accordance with a power of an input signal, for example, to thereby generate a pass phase whose characteristic is opposite to that of a pass phase of the amplifier to reduce a phase distortion of an output signal of the amplifier.

Figure 5:
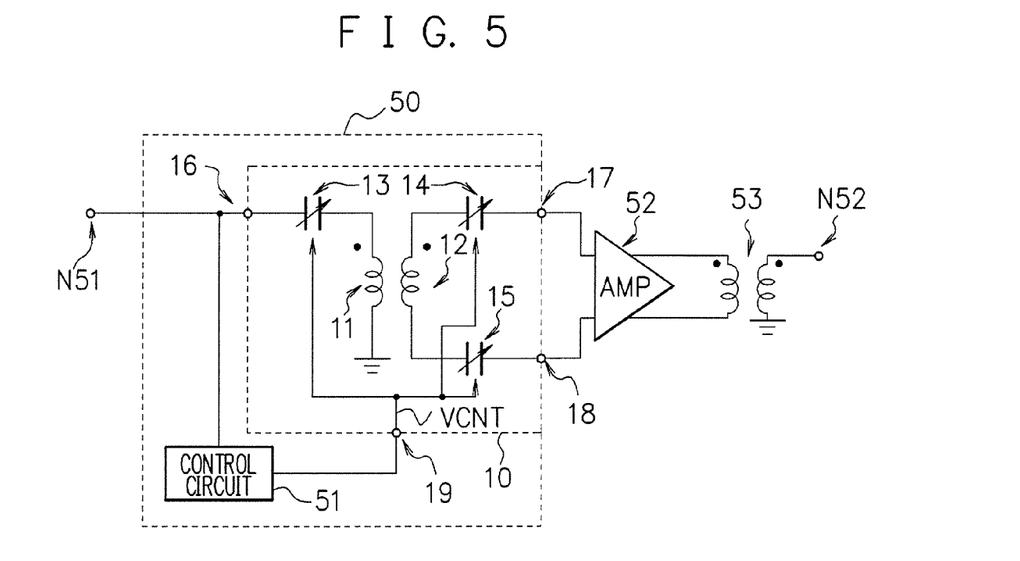
FIG. 5 is a diagram illustrating a configuration example of a predistorter in the present embodiment.

FIG. 5 is a diagram illustrating a configuration example of the predistorter in the present embodiment. In FIG. 5, components having the same functions as those of the components illustrated in FIG. 1 are denoted by the same reference numerals, and overlapped explanation will be omitted. A predistorter 50 in the present embodiment disposed at a previous stage of a differential amplifier 52, converts a single-phase signal input from an input end N51 into a differential signal, and outputs the differential signal after giving, to the signal, a phase distortion whose characteristic is opposite to that of a phase distortion of the differential amplifier 52. The differential amplifier 52 is connected to the second terminal 17 and the third terminal 18 as output terminals of the predistorter 50. An output of the differential amplifier 52 is supplied to an output end N52 via a balun 53.

The predistorter 50 includes the phase shifter 10 and a control circuit 51. The phase shifter 10 converts the single-phase signal input from the input end N51 via the first terminal 16 into the differential signal, and controls a pass phase by shifting a phase of the signal in accordance with the control signal VCNT. The control circuit 51 generates a control voltage in accordance with an input power of the signal input from the input end N51, and outputs the control voltage as the control signal VCNT to the phase shifter 10.

Figure 6:
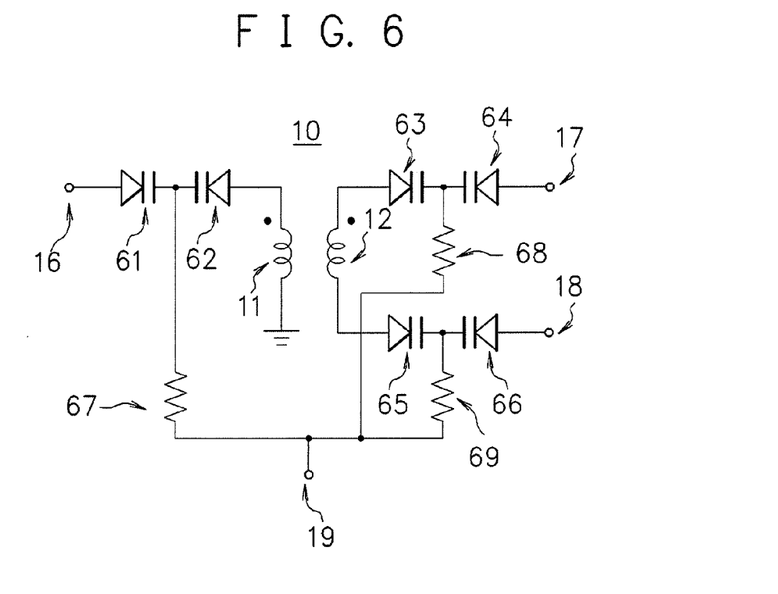
FIG. 6 is a diagram illustrating a configuration example of a phase shifter of the predistorter in the present embodiment.

FIG. 6 is a diagram illustrating a configuration example of the phase shifter 10 included in the predistorter 50. The phase shifter 10 illustrated in FIG. 6 is one in which varactors with a diode structure (variable capacitance diodes) are applied as the variable capacitors 13, 14, 15. In FIG. 6, components having the same functions as those of the components illustrated in FIG. 1 and FIG. 5 are denoted by the same reference numerals, and overlapped explanation will be omitted.

Two varactors 61, 62 corresponding to the variable capacitor 13 are connected in series between the first terminal 16 and the inductor 11. An anode of the varactor 61 is connected to the first terminal 16, and an anode of the varactor 62 is connected to one end of the inductor 11. A connecting point of cathodes of the varactors 61, 62 is connected to the control terminal 19 via a resistor 67, and capacitance values of the varactors 61, 62 are controlled in accordance with a control voltage (bias) supplied from the control terminal 19.

Two varactors 63, 64 corresponding to the variable capacitor 14 are connected in series between one end of the inductor 12 and the second terminal 17. An anode of the varactor 63 is connected to the one end of the inductor 12, and an anode of the varactor 64 is connected to the second terminal 17. A connecting point of cathodes of the varactors 63, 64 is connected to the control terminal 19 via a resistor 68, and capacitance values of the varactors 63, 64 are controlled in accordance with a control voltage (bias) supplied from the control terminal 19.

Two varactors 65, 66 corresponding to the variable capacitor 15 are connected in series between the other end of the inductor 12 and the third terminal 18. An anode of the varactor 65 is connected to the other end of the inductor 12, and an anode of the varactor 66 is connected to the third terminal 18. A connecting point of cathodes of the varactors 65, 66 is connected to the control terminal 19 via a resistor 69, and capacitance values of the varactors 65, 66 are controlled in accordance with a control voltage (bias) supplied from the control terminal 19.

Figure 7:
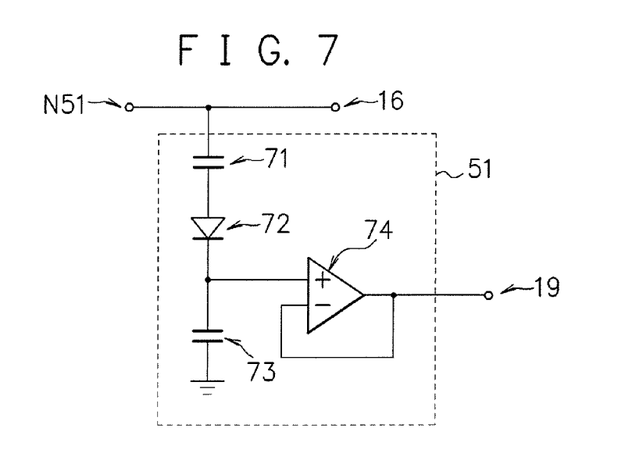
FIG. 7 is a diagram illustrating a configuration example of a control circuit of the predistorter in the present embodiment.

FIG. 7 is a diagram illustrating a configuration example of the control circuit 51 included in the predistorter 50. The control circuit 51 includes a power detection part formed of a capacitor 71, a diode 72, and a capacitor 73, and buffer 74 as a control signal generation part. One electrode of the capacitor 71 is connected to the input end N51, and the other electrode of the capacitor 71 is connected to an anode of the diode 72. One electrode of the capacitor 73 is connected to a cathode of the diode 72, and the other electrode of the capacitor 73 is connected to a reference potential. An electric potential at a connecting point of the cathode of the diode 72 and the capacitor 73 is input into the buffer 74.

The power detection part formed of the capacitor 71, the diode 72, and the capacitor 73 utilizes a rectification realized by the diode and the capacitors (characteristic in which a voltage of capacitor is in proportion to an envelope of high-frequency voltage amplitude), and detects an envelope of a power amplitude of a high-frequency signal input from the input end N51 to convert the envelope into a voltage or a current. The configuration of the power detection part is not limited to this configuration, and it is also possible to employ a configuration in which a mixer or an amplifier biased as either a class B or class C amplifier is used.

The buffer 74 converts a signal in accordance with the power amplitude of the input signal generated by the power detection part into a signal with an amplitude capable of being dealt with by the phase shifter 10. For example, it is set that a control voltage-pass phase characteristic of the phase shifter 10 is fps (VCNT), an input high-frequency power-output voltage characteristic of the power detection part is fdet (Pin), an input voltage-output voltage characteristic of the buffer 74 is fbuff (Vin), and an input power-pass phase characteristic of the amplifier being a target of compensation (differential amplifier 52) is famp (Pin). At this time, by determining the input voltage-output voltage characteristic fbuff (Vin) of the buffer 74 to satisfy a relationship of fps (fbuff (fdet (Pin)))=−famp (Pin), it becomes possible that the predistorter 50 gives a phase distortion whose characteristic is opposite to that of a phase distortion of the differential amplifier 52. Here, in order to prevent an influence of delay due to charge and discharge of the capacitors, an output resistance of the buffer 74 is set to an output resistance so that a time constant determined by a product of a resistance value of the output resistance and a capacitance value of the variable capacitor seen from the buffer 74 becomes sufficiently smaller than a reciprocal of frequency of an envelope of an input power.

Figure 8:
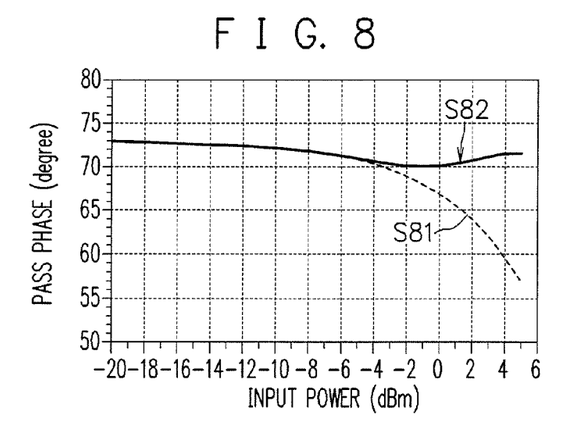
FIG. 8 is a diagram illustrating a simulation result related to a distortion compensation characteristic obtained by the predistorter in the present embodiment.

FIG. 8 illustrates a simulation result related to a distortion compensation characteristic when the predistorter in the present embodiment is applied to an amplifier which causes the phase distortion in accordance with the input power. In FIG. 8, S81 indicates an input power-pass phase characteristic when only the amplifier is used, and S82 indicates an input power-pass phase characteristic when the predistorter in the present embodiment is applied. As is apparent from FIG. 8, by applying the predistorter using the phase shifter in the present embodiment, a change in the pass phase in accordance with the input power is reduced, resulting in that the phase distortion is suppressed.

Figure 9:
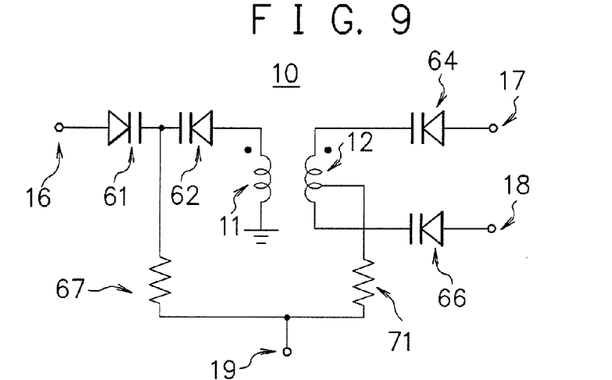
FIG. 9 is a diagram illustrating another configuration example of the phase shifter of the predistorter in the present embodiment.

FIG. 9 is a diagram illustrating another configuration example of the phase shifter 10 included in the predistorter 50. In FIG. 9, components having the same functions as those of the components illustrated in FIG. 6 are denoted by the same reference numerals, and overlapped explanation will be omitted. The phase shifter 10 illustrated in FIG. 9 is supplied, to a center tap (intermediate tap) of the inductor 12 on the differential side, the control signal (control voltage) VCNT via a resistor 71. By employing a configuration illustrated in FIG. 9, it is possible to reduce a number of varactors (variable capacitance diodes) included in the phase shifter 10 and the capacitance values. The capacitance value of the variable capacitor seen from the buffer 74 regarding the differential side becomes ¼, so that the output resistance of the buffer 74 can be increased, and it becomes possible to reduce a consumption current of the buffer 74.

<Phased Array Antenna>

Next, a phased array antenna using the phase shifter in the present embodiment will be described. The phased array antenna includes arrayed plurality of antennas, and can electrically control a directivity. The phased array antenna is used for a mobile communication, a radar and the like, for example. The phased array antenna can distribute a signal from a single signal source at a time of transmission, control an excitation phase of each antenna by changing each pass phase of the phase shifter, and control a maximum gain direction (main beam direction). The phased array antenna can receive, at a time of reception, only a signal from the maximum gain direction by shifting phases of signals received by the respective antennas in the respective phase shifters and combining the resultants, and can control a reception direction by changing the pass phase of the phase shifter.

Figure 10:
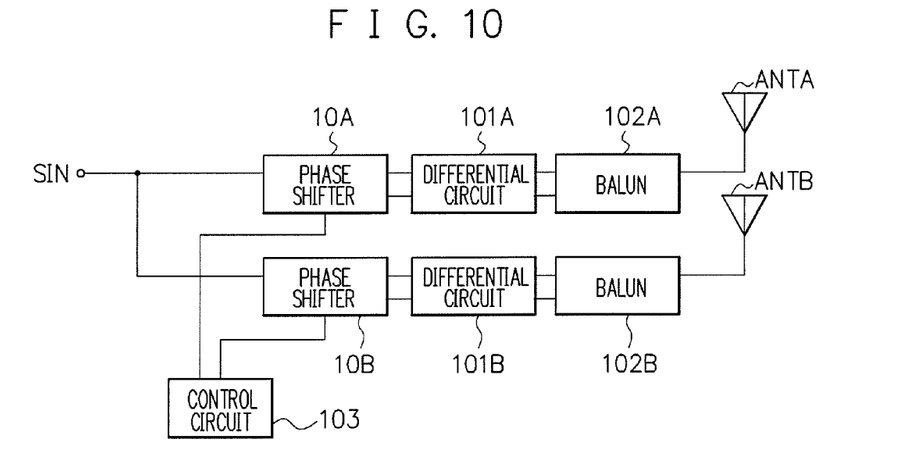
FIG. 10 is a diagram illustrating a configuration example of a phased array antenna in the present embodiment.

FIG. 10 is a diagram illustrating a configuration example of the phased array antenna in the present embodiment. The phased array antenna in the present embodiment includes a plurality of sets of the phase shifters 10 in the present embodiment, differential circuits 101, baluns 102, and antennas ANTs. The antennas ANTs are arrayed at certain intervals. In FIG. 10, a phased array antenna including two sets being a set of a phase shifter 10A, a differential circuit 101A, a balun 102A, and an antenna ANTA, and a set of a phase shifter 10B, a differential circuit 101B, a balun 102B, and an antenna ANTB, is illustrated for simplification. However, a configuration illustrated in FIG. 10 is an example, and an arbitrary number of sets of the phase shifters 10, the differential circuits 101, the baluns 102, and the antennas ANTs included in the phased array antenna can be employed.

Figure 11A:
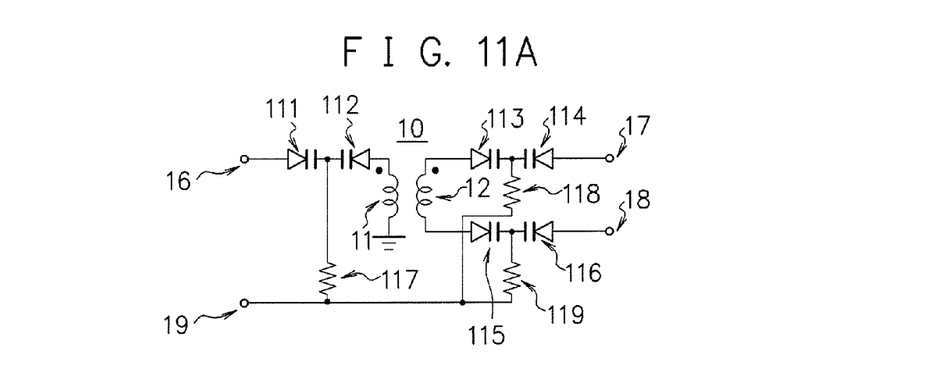
FIG. 11A is a diagram illustrating a configuration example of a phase shifter of the phased array antenna in the present embodiment.
Figure 11B:
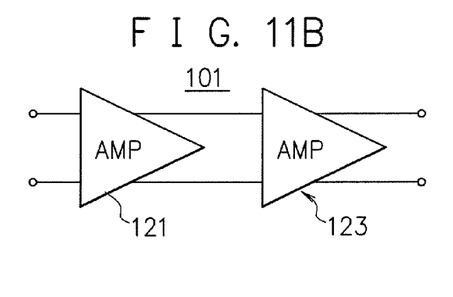
FIG. 11B is a diagram illustrating a configuration example of a differential circuit of the phased array antenna in the present embodiment.
Figure 11C:
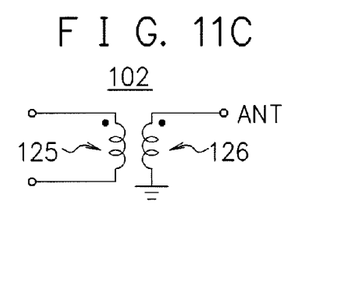
FIG. 11C is a diagram illustrating a configuration example of a balun of the phased array antenna in the present embodiment.

Configuration examples of the phase shifter 10, the differential circuit 101, and the balun 102 illustrated in FIG. 10 are illustrated in FIG. 11A, FIG. 11B, and FIG. 11C, respectively. FIG. 11A is a diagram illustrating the configuration example of the phase shifter 10 included in the phased array antenna. FIG. 11A illustrates, as an example, the phase shifter 10 in which varactors with a diode structure (variable capacitance diodes) are applied as variable capacitors. In FIG. 11A, components having the same functions as those of the components illustrated in FIG. 1 are denoted by the same reference numerals, and overlapped explanation will be omitted.

Two varactors 111, 112 are connected in series between the first terminal 16 as a signal input terminal and the inductor 11. An anode of the varactor 111 is connected to the first terminal 16, and an anode of the varactor 112 is connected to one end of the inductor 11. A connecting point of cathodes of the varactors 111, 112 is connected to the control terminal 19 via a resistor 117, and capacitance values of the varactors 111, 112 are controlled in accordance with a control voltage (bias) supplied from the control terminal 19.

Two varactors 113, 114 are connected in series between one end of the inductor 12 and the second terminal 17 as a signal output terminal. An anode of the varactor 113 is connected to the one end of the inductor 12, and an anode of the varactor 114 is connected to the second terminal 17. A connecting point of cathodes of the varactors 113, 114 is connected to the control terminal 19 via a resistor 118, and capacitance values of the varactors 113, 114 are controlled in accordance with a control voltage (bias) supplied from the control terminal 19.

Two varactors 115, 116 are connected in series between the other end of the inductor 12 and the third terminal 18 as a signal output terminal. An anode of the varactor 115 is connected to the other end of the inductor 12, and an anode of the varactor 116 is connected to the third terminal 18. A connecting point of cathodes of the varactors 115, 116 is connected to the control terminal 19 via a resistor 119, and capacitance values of the varactors 115, 116 are controlled in accordance with a control voltage (bias) supplied from the control terminal 19.

The phase shifter 10 illustrated in FIG. 11A converts a single-phase signal input from the first terminal 16 into a differential signal, gives a pass phase in accordance with a control signal input from the control terminal 19 to the differential signal, and outputs the resultant from the second terminal 17 and the third terminal 18.

FIG. 11B is a diagram illustrating the configuration example of the differential circuit 101 included in the phased array antenna. The differential circuit 101 includes, for example, a differential amplifier 121 as a previous-stage amplifier, and a differential amplifier 123 as a subsequent-stage amplifier. FIG. 11C is a diagram illustrating the configuration example of the balun 102 included in the phased array antenna. The balun 102 is a balun using a transformer including an inductance 125 and an inductance 126, for example.

An operation of the phased array antenna in the present embodiment will be described. A single-phase signal input from an input end SIN is converted into a differential signal by the phase shifter 10 in each set of the phase shifter 10, the differential circuit 101, the balun 102 and the antenna ANT, and then amplified by the differential circuit 101. Subsequently, the differential signal is converted into a single-phase signal by the balun 102, and output from the antenna ANT. At this time, a pass phase in the phase shifter 10 is controlled by a control signal from a control circuit 103 in each of the sets.

Here, the respective antennas ANTA, ANTB are non-directional and arrayed at an interval of ($\lambda$/2), and it is set that the phase shifters 10 are the same characteristic, the differential circuits 101 are the same characteristic, and the baluns 102 are the same characteristic. The control circuit 103 is set to be able to output two levels of VL, VH as control signals (control voltages). It is set that a phase shift amount in the phase shifter 10 becomes 0 degree when the control signal (control voltage) from the control circuit 103 is VL, and the phase shift amount becomes 30 degrees when the control signal (control voltage) is VH.

Figure 12:
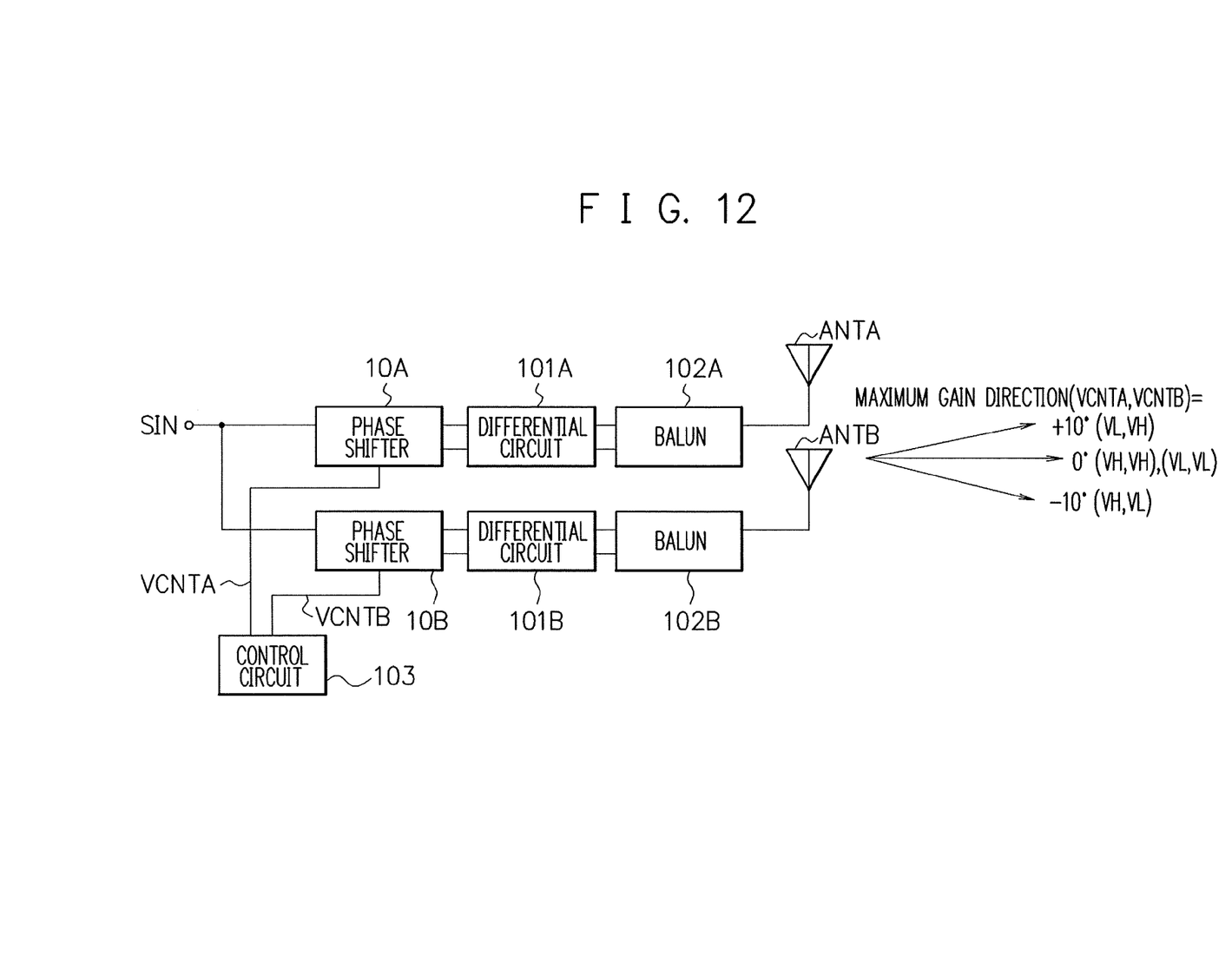
FIG. 12 is a diagram illustrating an example of control of the phased array antenna in the present embodiment.

Therefore, for example, when both of a control voltage VCNTA supplied to the phase shifter 10A and a control voltage VCNTB supplied to the phase shifter 10B from the control circuit 103 are VL or VH, radio waves being the same phase are radiated from the antennas ANTA, ANTB, so that a maximum gain direction becomes a direction perpendicular to a line segment connecting the mutual antennas, as illustrated in FIG. 12. This direction is set to 0 degree.

When the control voltage VCNTA supplied to the phase shifter 10A is VH, and the control voltage VCNTB supplied to the phase shifter 10B is VL, a phase of a radio wave radiated from the antenna ANTA leads by 30 degrees from that of a radio wave radiated from the antenna ANTB. Accordingly, as illustrated in FIG. 12, a direction inclined toward the antenna ANTB side from the 0 degree direction becomes the maximum gain direction based on the Huygens principle, and because of the antenna interval ($\lambda$/2) and the phase difference of 30 degrees, the maximum gain direction becomes −10 degrees.

When the control voltage VCNTA supplied to the phase shifter 10A is VL, and the control voltage VCNTB supplied to the phase shifter 10B is VH, a phase of a radio wave radiated from the antenna ANTE leads by 30 degrees from that of a radio wave radiated from the antenna ANTA. Accordingly, as illustrated in FIG. 12, a direction inclined toward the antenna ANTA side from the 0 degree direction becomes the maximum gain direction based on the Huygens principle, and because of the antenna interval ($\lambda$/2) and the phase difference of 30 degrees, the maximum gain direction becomes +10 degrees. As described above, a phased array antenna capable of controlling the maximum gain direction by 20 degrees can be realized, for example.

Figure 13:
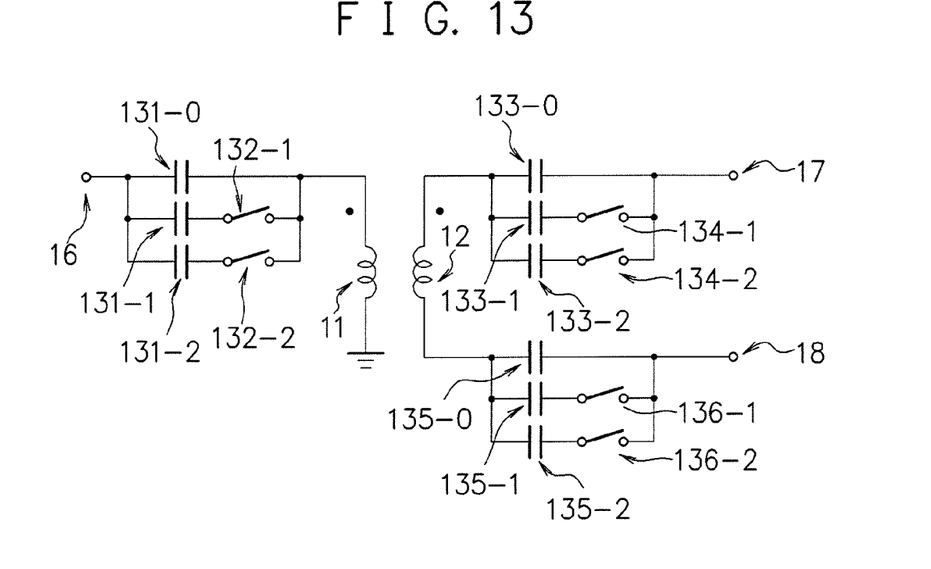
FIG. 13 is a diagram illustrating another configuration example of the phase shifter of the phased array antenna in the present embodiment.

Note that as a configuration example of the phase shifter 10 included in the phased array antenna, FIG. 11A illustrates one in which the varactors (variable capacitance diodes) are applied as the variable capacitors. The configuration example is not limited to this, and it is also possible to apply, as the variable capacitors of the phase shifter 10 of the phased array antenna, circuits each formed of fixed capacitors whose capacitance values are fixed and switches, as illustrated in FIG. 13, for example, in which it is possible to realize a function similar to that of the phase shifter 10 illustrated in FIG. 11A. FIG. 13 is a diagram illustrating another configuration example of the phase shifter 10 included in the phased array antenna in the present embodiment.

The variable capacitor connected in series between the first terminal 16 as a signal input terminal and the inductor 11 is realized by connecting a fixed capacitor 131-0, series-connected fixed capacitor 131-1 and switch 132-1, and series-connected fixed capacitor 131-2 and switch 132-2 in parallel. Each of the fixed capacitors 131-0, 131-1, 131-2 is a capacitor whose capacitance value is fixed, and the switches 132-1, 132-2 are controlled to be opened/closed by a control signal from the control circuit 103.

The variable capacitor connected in series between one end of the inductor 12 and the second terminal 17 as a signal output terminal is realized by connecting a fixed capacitor 133-0, series-connected fixed capacitor 133-1 and switch 134-1, and series-connected fixed capacitor 133-2 and switch 134-2 in parallel. Each of the fixed capacitors 133-0, 133-1, 133-2 is a capacitor whose capacitance value is fixed, and the switches 134-1, 134-2 are controlled to be opened/closed by a control signal from the control circuit 103.

The variable capacitor connected in series between the other end of the inductor 12 and the third terminal 18 as a signal output terminal is realized by connecting a fixed capacitor 135-0, series-connected fixed capacitor 135-1 and switch 136-1, and series-connected fixed capacitor 135-2 and switch 136-2 in parallel. Each of the fixed capacitors 135-0, 135-1, 135-2 is a capacitor whose capacitance value is fixed, and the switches 136-1, 136-2 are controlled to be opened/closed by a control signal from the control circuit 103.

In the aforementioned FIG. 10 to FIG. 12, the configuration of the phased array antenna for transmission is illustrated as an example, but, it is possible to realize a phased array antenna for reception with a similar configuration.

Figure 14:
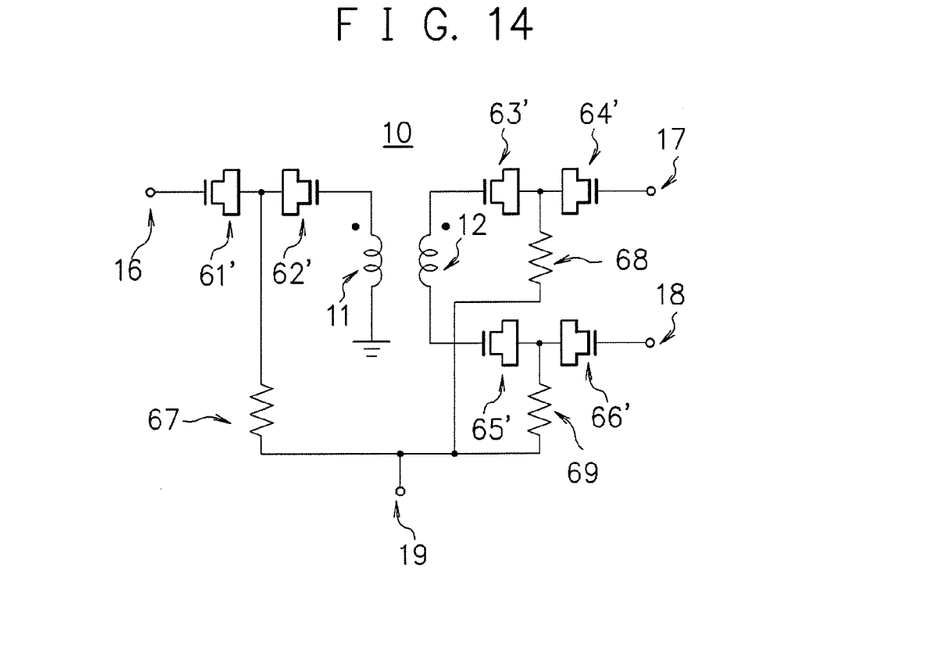
FIG. 14 is a diagram illustrating another configuration example of the phase shifter in the present embodiment.

FIG. 14 is a diagram illustrating another configuration example of the phase shifter 10. The phase shifter 10 illustrated in FIG. 14 is one in which varactors with a MOS structure are applied as the variable capacitors 13, 14, 15. In FIG. 14, components having the same functions as those of the components illustrated in FIG. 1 are denoted by the same reference numerals, and overlapped explanation will be omitted.

Two varactors 61', 62' corresponding to the variable capacitor 13 are connected in series between the first terminal 16 and the inductor 11. A connecting point of the varactors 61', 62' is connected to the control terminal 19 via the resistor 67, and capacitance values of the varactors 61', 62' are controlled in accordance with a control signal input from the control terminal 19.

Two varactors 63', 64' corresponding to the variable capacitor 14 are connected in series between one end of the inductor 12 and the second terminal 17. A connecting point of the varactors 63', 64' is connected to the control terminal 19 via the resistor 68, and capacitance values of the varactors 63', 64' are controlled in accordance with a control signal input from the control terminal 19.

Two varactors 65', 66' corresponding to the variable capacitor 15 are connected in series between the other end of the inductor 12 and the third terminal 18. A connecting point of the varactors 65', 66' is connected to the control terminal 19 via the resistor 69, and capacitance values of the varactors 65', 66' are controlled in accordance with a control signal input from the control terminal 19.

The disclosed phase shifter can obtain a desired pass phase by changing capacitance values of variable capacitors with the use of a control signal, has a small loss, and can realize both functions of single-phase-differential conversion and the phase shifter by suppressing an increase in a circuit area and a number of parts.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase shifter, comprising:
a transformer which includes a first inductor and a second inductor, one end of the first inductor being connected to a reference potential;
a first variable capacitor connected in series between the other end of the first inductor and a first terminal;
a second variable capacitor connected in series between one end of the second inductor and a second terminal; and
a third variable capacitor connected in series between the other end of the second inductor and a third terminal,
wherein capacitance values of the first variable capacitor, the second variable capacitor, and the third variable capacitor are controlled based on a common control signal for controlling a phase difference between an input signal and an output signal, and
the phase difference between the input signal and the output signal is controlled by controlling a phase shift amount of the output signal, the phase shift amount being controlled by controlling capacitance values of the first variable capacitor, the second variable capacitor, and the third variable capacitor via variation in the common control signal.

2. The phase shifter according to claim 1,
wherein at least one of the first variable capacitor, the second variable capacitor and the third variable capacitor includes a variable capacitance diode whose capacitance value is controlled based on the common control signal.

3. The phase shifter according to claim 1,
wherein at least one of the first variable capacitor, the second variable capacitor and the third variable capacitor includes a varactor with a metal oxide semiconductor structure whose capacitance value is controlled based on the common control signal.

4. The phase shifter according to claim 1,
wherein at least one of the first variable capacitor, the second variable capacitor and the third variable capacitor includes a variable capacitor including a plurality of fixed capacitors and a plurality of switches configured to be controlled based on the common control signal.

5. The phase shifter according to claim 1,
wherein a single-phase signal input into the first terminal is converted into a differential signal and the differential signal is output from the second terminal and the third terminal.

6. The phase shifter according to claim 1,
wherein a differential signal input into the second terminal and the third terminal is converted into a single-phase signal and the single-phase signal is output from the first terminal.

7. A predistorter, comprising:
a phase shifter configured to control a phase difference between an input signal and an output signal in accordance with a common control signal; and
a control circuit configured to generate the common control signal that causes a first phase distortion in the phase shifter in accordance with an input power of a signal input into the phase shifter and to output the common control signal to the phase shifter, the first phase distortion being opposite to characteristic of a phase distortion caused in a circuit connected at a subsequent stage of the phase shifter,
wherein the phase shifter includes:
a transformer which includes a first inductor and a second inductor, one end of the first inductor being connected to a reference potential;
a first variable capacitor connected in series between the other end of the first inductor and a first terminal;
a second variable capacitor connected in series between one end of the second inductor and a second terminal; and
a third variable capacitor connected in series between the other end of the second inductor and a third terminal,
wherein capacitance values of the first variable capacitor, the second variable capacitor, and the third variable capacitor are controlled based on the common control signal, and
the phase difference between the input signal and the output signal is controlled by controlling a phase shift amount of the output signal, the phase shift amount being controlled by controlling capacitance values of the first variable capacitor, the second variable capacitor, and the third variable capacitor via variation in the common control signal.

8. The predistorter according to claim 7,
wherein the control circuit includes:
a power detection part configured to detect the input power of the signal input into the phase shifter; and
a control signal generation part configured to generate the common control signal and to output the common control signal to the phase shifter based on a detection result obtained by the power detection part.

9. The predistorter according to claim 8,
wherein at least one of the first variable capacitor, the second variable capacitor and the third variable capacitor includes variable capacitance diode; and
the control signal generation part generates a control voltage supplied to the variable capacitance diode on the basis of the detection result obtained by the power detection part.

10. The predistorter according to claim 8,
wherein at least one of the first variable capacitor, the second variable capacitor and the third variable capacitor includes a varactor with a metal oxide semiconductor structure whose capacitance value is controlled based on the common control signal.

11. The predistorter according to claim 8,
wherein at least one of the first variable capacitor, the second variable capacitor and the third variable capacitor includes a variable capacitor including a plurality of fixed capacitors and a plurality of switches configured to be controlled based on the common control signal.

12. A phased array antenna, comprising:
a plurality of sets of phase shifters configured to control a phase difference between an input signal and an output signal in accordance with a common control signal, amplifiers configured to amplify a signal whose phase is controlled by the phase shifter, and antennas configured to output the signal amplified by the amplifier; and
a control circuit configured to generate the common control signal for controlling the phase difference between the input signal and the output signal in the phase shifter in accordance with a phase difference of signals output from the antennas of the respective sets,
wherein each of the phase shifters includes:
a transformer which includes a first inductor and a second inductor, one end of the first inductor being connected to a reference potential;
a first variable capacitor connected in series between the other end of the first inductor and a first terminal;
a second variable capacitor connected in series between one end of the second inductor and a second terminal; and
a third variable capacitor connected in series between the other end of the second inductor and a third terminal,
wherein capacitance values of the first variable capacitor, the second variable capacitor, and the third variable capacitor are controlled based on the common control signal, and
the phase difference between the input signal and the output signal is controlled by controlling a phase shift amount of the output signal, the phase shift amount being controlled by controlling capacitance values of the first variable capacitor, the second variable capacitor, and the third variable capacitor via variation in the common control signal.

13. The phased array antenna according to claim 12,
wherein at least one of the first variable capacitor, the second variable capacitor and the third variable capacitor includes a variable capacitance diode whose capacitance value is controlled based on the common control signal.

14. The phased array antenna according to claim 12,
wherein at least one of the first variable capacitor, the second variable capacitor and the third variable capacitor includes a varactor with a metal oxide semiconductor structure whose capacitance value is controlled based on the common control signal.

15. The phased array antenna according to claim 12,
wherein at least one of the first variable capacitor, the second variable capacitor and the third variable capacitor includes a variable capacitor including a plurality of fixed capacitors and a plurality of switches configured to be controlled based on the common control signal.

16. A phased array antenna, comprising:
a plurality of sets of phase shifters configured to control a phase difference between an input signal and an output signal in accordance with a common control signal, and antennas; and
a control circuit configured to generate the common control signal for controlling the phase difference between the input signal and the output signal in the phase shifter,
wherein each of the phase shifters includes:
a transformer which includes a first inductor and a second inductor, one end of the first inductor being connected to a reference potential;
a first variable capacitor connected in series between the other end of the first inductor and a first terminal;
a second variable capacitor connected in series between one end of the second inductor and a second terminal; and
a third variable capacitor connected in series between the other end of the second inductor and a third terminal,
wherein capacitance values of the first variable capacitor, the second variable capacitor, and the third variable capacitor are controlled based on the common control signal, and
the phase difference between the input signal and the output signal is controlled by controlling a phase shift amount of the output signal, the phase shift amount being controlled by controlling capacitance values of the first variable capacitor, the second variable capacitor, and the third variable capacitor via variation in the common control signal.

17. The phased array antenna according to claim 16,
wherein at least one of the first variable capacitor, the second variable capacitor and the third variable capacitor includes a variable capacitance diode whose capacitance value is controlled based on the common control signal.

18. The phased array antenna according to claim 16,
wherein at least one of the first variable capacitor, the second variable capacitor and the third variable capacitor includes a varactor with a metal oxide semiconductor structure whose capacitance value is controlled based on the common control signal.

19. The phased array antenna according to claim 16,
wherein at least one of the first variable capacitor, the second variable capacitor and the third variable capacitor includes a variable capacitor including a plurality of fixed capacitors and a plurality of switches configured to be controlled based on the common control signal.

* * * * *